US012295155B2

(12) United States Patent
Calvo et al.

(10) Patent No.: US 12,295,155 B2
(45) Date of Patent: May 6, 2025

(54) ASYMMETRIC HALO-IMPLANT BODY-SOURCE-TIED SEMICONDUCTOR-ON-INSULATOR (SOI) DEVICE

(71) Applicant: Newport Fab, LLC, Newport Beach, CA (US)

(72) Inventors: Allan K. Calvo, Tustin, CA (US); Kamei Masayuki, Toyama (JP)

(73) Assignee: Newport Fab, LLC, Newport Beach, CA (US)

( * ) Notice: Subject to any disclaimer, the term of this patent is extended or adjusted under 35 U.S.C. 154(b) by 463 days.

(21) Appl. No.: 17/748,863

(22) Filed: May 19, 2022

(65) Prior Publication Data

US 2022/0293790 A1    Sep. 15, 2022

Related U.S. Application Data

(63) Continuation-in-part of application No. 16/928,962, filed on Jul. 14, 2020, now Pat. No. 11,581,215.

(51) Int. Cl.
*H10D 30/60* (2025.01)
*H10D 30/01* (2025.01)
*H10D 86/00* (2025.01)

(52) U.S. Cl.
CPC ......... *H10D 30/603* (2025.01); *H10D 30/022* (2025.01); *H10D 86/201* (2025.01)

(58) Field of Classification Search
CPC ............. H01L 29/7835; H01L 27/1203; H01L 29/66492; H10D 30/603; H10D 30/022; H10D 86/201
See application file for complete search history.

(56) References Cited

U.S. PATENT DOCUMENTS

| | | | | |
|---|---|---|---|---|
| H986 | H * | 11/1991 | Codella et al. | |
| 5,364,807 | A * | 11/1994 | Hwang | H01L 29/7835 257/E29.268 |
| 6,797,576 | B1 * | 9/2004 | Teng | H01L 29/66492 257/E29.054 |
| 7,419,863 | B1 * | 9/2008 | Bulucea | H01L 21/823892 257/E21.585 |
| 8,110,869 | B2 * | 2/2012 | Bhalla | H01L 29/7813 257/329 |
| 8,610,207 | B2 * | 12/2013 | Bulucea | H01L 21/823807 257/408 |
| 10,325,833 | B1 * | 6/2019 | Kanawati | H01L 23/4824 |
| 2007/0141792 | A1 * | 6/2007 | Cai | H01L 29/7816 257/E29.066 |

(Continued)

*Primary Examiner* — Eugene Lee
(74) *Attorney, Agent, or Firm* — Farjami & Farjami LLP

(57) ABSTRACT

A semiconductor-on-insulator (SOI) device includes a semiconductor layer situated over a buried oxide layer, the buried oxide layer being situated over a substrate. An SOI transistor is situated in the semiconductor layer and includes a transistor body, gate fingers, source regions, and drain regions. The transistor body has a first conductivity type. The source regions and the drain regions have a second conductivity type opposite to the first conductivity type. The transistor body is electrically tied to at least one source region. An asymmetric halo-implant region having the first conductivity type adjoins the at least one source region. No halo-implant region adjoins the drain regions.

20 Claims, 11 Drawing Sheets

(56) References Cited

U.S. PATENT DOCUMENTS

2012/0061761 A1\* 3/2012 Makiyama .......... H01L 29/1083
257/E21.632
2013/0126970 A1\* 5/2013 Bulucea ............ H01L 29/66659
257/335

\* cited by examiner

ASYMMETRIC HALO-IMPLANT BODY-SOURCE-TIED SEMICONDUCTOR-ON-INSULATOR (SOI) DEVICE

CLAIMS OF PRIORITY

The present application is a continuation-in-part of and claims the benefit of and priority to application Ser. No. 16/928,962 filed on Jul. 14, 2020, titled "Body-Source-Tied Semiconductor-On-Insulator (SOI) Transistor,". The entire content of the above-identified application is hereby incorporated fully by reference into the present application.

BACKGROUND

Semiconductor-on-insulator (SOI) devices are commonly employed in radio frequency (RF) circuits where high noise isolation and low signal loss are required. These SOI devices use a buried oxide (BOX) to isolate RF circuit components, such as transistors and/or passive components, in a top semiconductor layer. In amplifier designs, such as low noise amplifiers, SOI transistors are required to be highly linear in order to meet more stringent wireless communication standards.

Conventional techniques utilized to meet linearity requirements result in degraded device performance. For example, transistors can exhibit detrimental body effects. As another example, transistors can exhibit increased parasitic capacitances, which in turn result in increased noise in the amplifier. Conventional techniques utilized to meet linearity requirements can also have increased footprints, and may not be practical for transistors with longer channel lengths.

Thus, there is a need in the art for SOI transistors that have improved linearity without sacrificing performance parameters and manufacturing conveniences.

SUMMARY

The present disclosure is directed to an asymmetric halo-implant body-source-tied semiconductor-on-insulator (SOI) device, substantially as shown in and/or described in connection with at least one of the figures, and as set forth in the claims.

DETAILED DESCRIPTION

Figure 1:
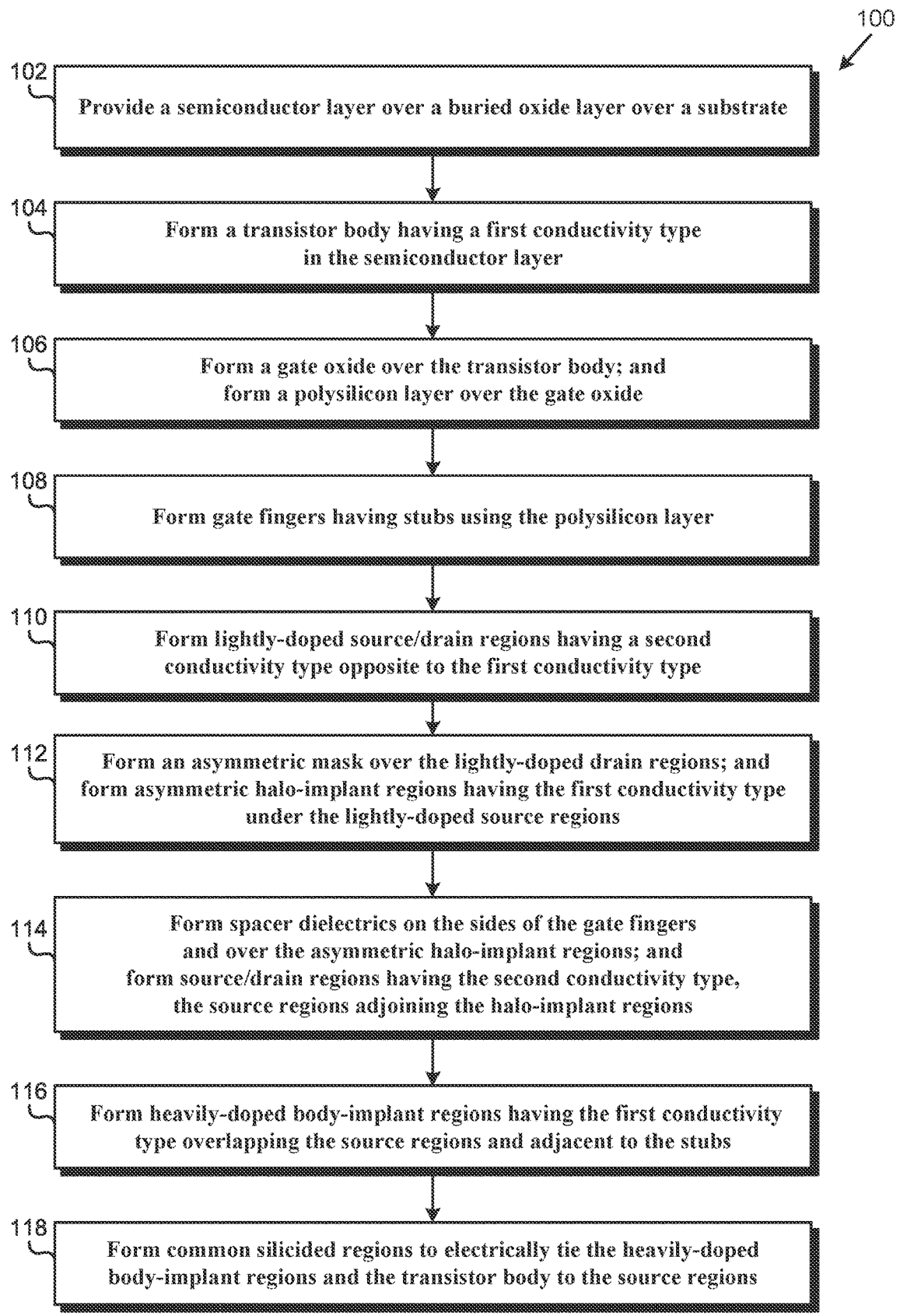
FIG. 1 illustrates a flowchart of an exemplary method for manufacturing a semiconductor-on-insulator (SOI) device according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
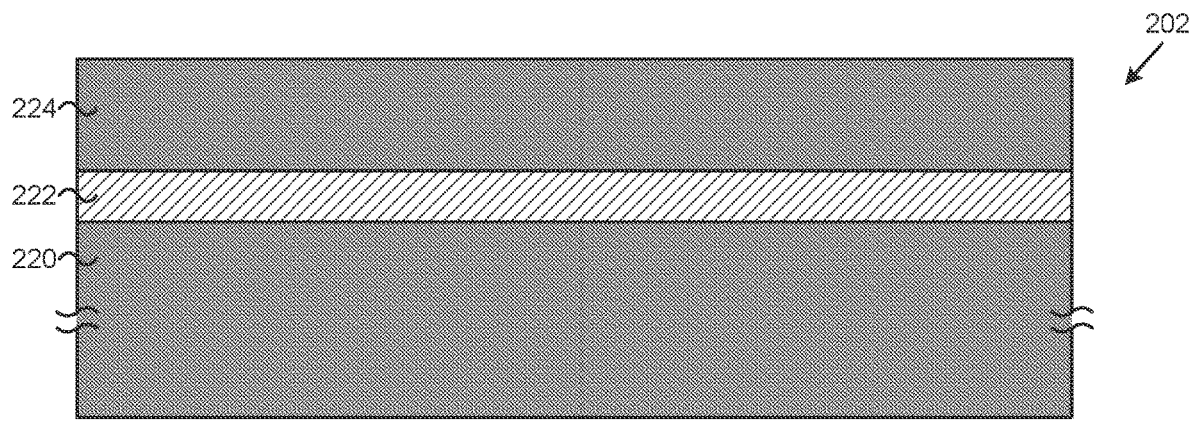
FIG. 2 illustrates a portion of an SOI device structure processed in accordance with action 102 in the flowchart of FIG. 1 according to one implementation of the present application.
Figure 3:
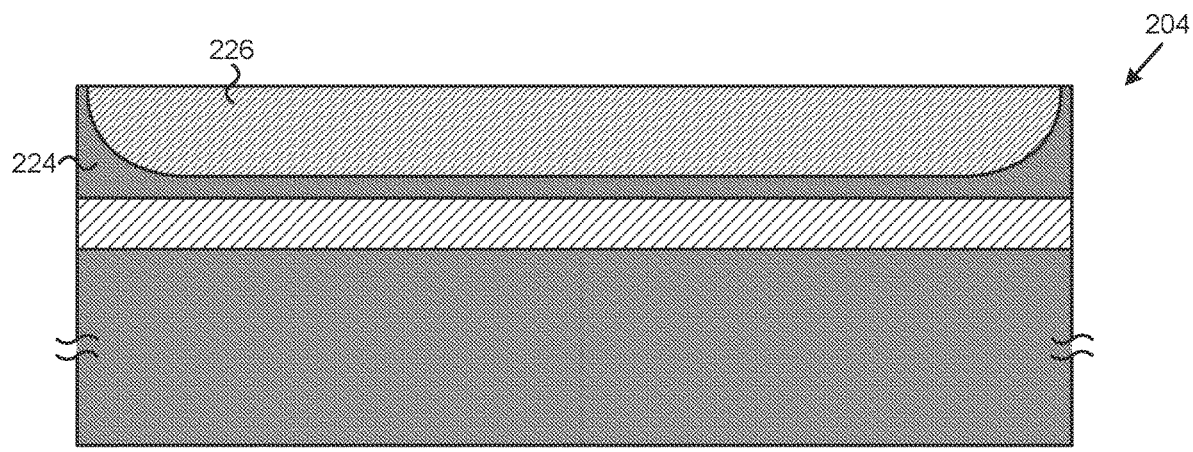
FIG. 3 illustrates a portion of an SOI device structure processed in accordance with action 104 in the flowchart of FIG. 1 according to one implementation of the present application.

FIG. 1 illustrates a flowchart of an exemplary method for manufacturing a semiconductor-on-insulator (SOI) device according to one implementation of the present application. Structures shown in FIGS. 2 through 11D illustrate the results of performing actions 102 through 118 shown in the flowchart of FIG. 1. For example, FIG. 2 shows an SOI device structure after performing action 102 in FIG. 1, FIG. 3 shows an SOI device structure after performing action 104 in FIG. 1, and so forth.

Actions 102 through 118 shown in the flowchart of FIG. 1 are sufficient to describe one implementation of the present inventive concepts. Other implementations of the present inventive concepts may utilize actions different from those shown in the flowchart of FIG. 1. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 2 illustrates a portion of an SOI device structure processed in accordance with action 102 in the flowchart of FIG. 1 according to one implementation of the present application. As shown in FIG. 2, SOI device structure 202 is provided. SOI device structure 202 includes semiconductor layer 224 over buried oxide (BOX) layer 222 over substrate 220.

Semiconductor layer 224, buried oxide (BOX) layer 222, and substrate 220 can be provided together as a pre-fabricated SOI wafer. In various implementations, a bonded and etch back SOI (BESOI) process, a separation by implantation of oxygen (SIMOX) process, or a "smart cut" process can be used for fabricating the SOI wafer as known in the art.

In various implementations substrate 220 can be silicon, high-resistivity silicon, germanium, or group III-V material. For example, substrate 220 can be monocrystalline bulk silicon. BOX layer 222 is situated on substrate 220. BOX layer 222 can be silicon dioxide or another oxide. Semiconductor layer 224 is situated on BOX layer 222. Semiconductor layer 224 can include any semiconductor material. For example, semiconductor layer 224 can be epitaxial silicon. As described below, one or more SOI transistors can be fabricated in semiconductor layer 224.

FIG. 3 illustrates a portion of an SOI device structure processed in accordance with action 104 in the flowchart of FIG. 1 according to one implementation of the present application. As shown in FIG. 3, in SOI device structure 204, a transistor body 226 is formed in semiconductor layer 224. Transistor body 226 has a first conductivity type. For example, transistor body 226 can be implanted with boron or another appropriate P type dopant, such that transistor body 226 has P type conductivity.

Figure 4:
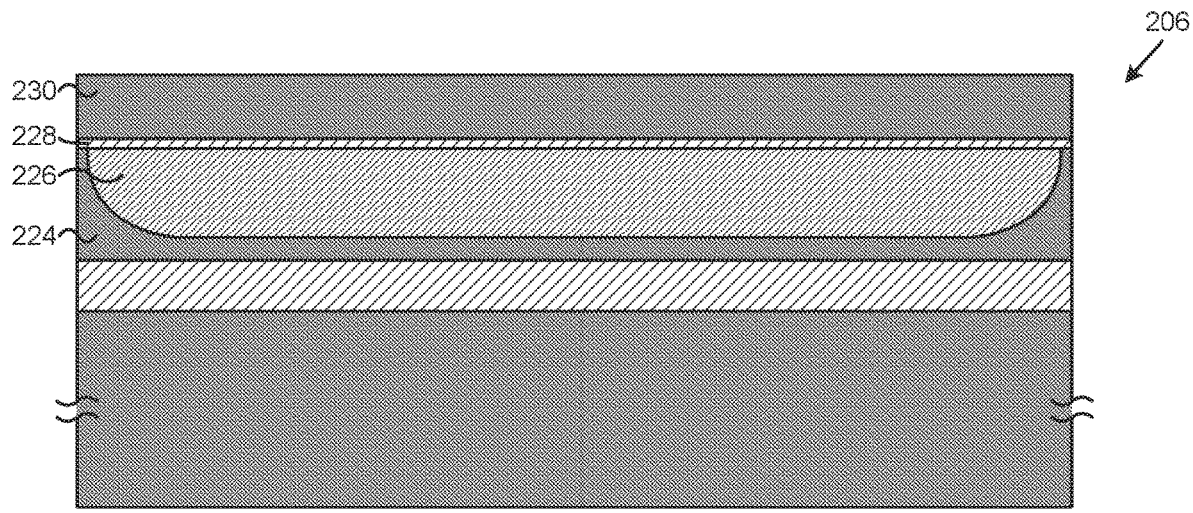
FIG. 4 illustrates an SOI device structure processed in accordance with action 106 in the flowchart of FIG. 1 according to one implementation of the present application.

FIG. 4 illustrates a portion of an SOI device structure processed in accordance with action 106 in the flowchart of FIG. 1 according to one implementation of the present application. As shown in FIG. 4, in SOI device structure 206, gate oxide 228 is formed over transistor body 226 as well as over portions of semiconductor layer 224. Gate oxide 228 can comprise, for example, silicon dioxide ($SiO_2$) or another dielectric. As also shown in FIG. 4, polycrystalline silicon (polysilicon) layer 230 is formed over gate oxide 228. Gate oxide 228 and polysilicon layer 230 can be formed by any technique known in the art.

Figure 5:
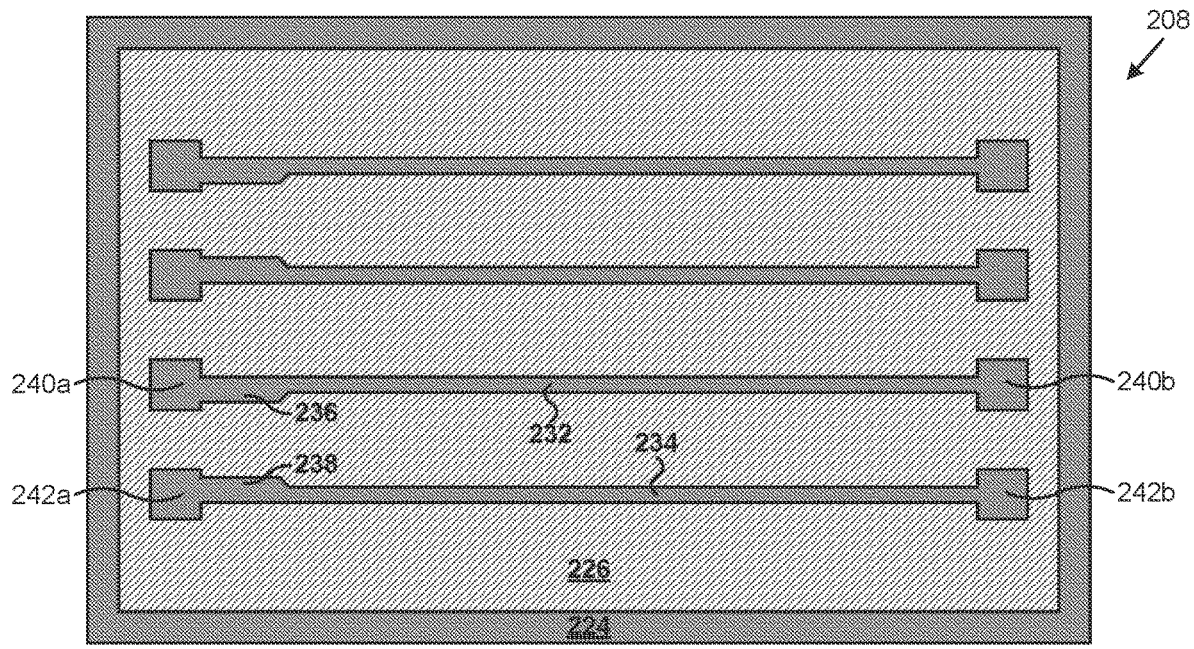
FIG. 5 illustrates a top view of a portion of an SOI device structure processed in accordance with action 108 in the flowchart of FIG. 1 according to one implementation of the present application.

FIG. 5 illustrates a top view of a portion of an SOI device structure processed in accordance with action 108 in the flowchart of FIG. 1 according to one implementation of the present application. As shown in FIG. 5, in SOI device structure 208, exemplary gate fingers 232 and 234 having respective stubs 236 and 238 are formed from polysilicon layer 230 (shown in FIG. 4). Gate contact areas (also referred to as "gate contacts" for simplicity) 240a, 240b, 242a, and 242b are also formed from polysilicon layer 230 (shown in FIG. 4). Gate fingers 232 and 234 and gate contacts 240a, 240b, 242a, and 242b can be formed by patterning polysilicon layer 230 (shown in FIG. 4) using any technique known in the art. Gate oxide 228 (shown in FIG. 4) may be concurrently patterned. Top views of transistor body 226 and semiconductor layer 224 are also shown in FIG. 5.

Gate fingers 232 and 234 are narrow elongated segments of polysilicon. Gate fingers 232 and 234 can be used to induce a conductive channel in transistor body 226. Gate contacts 240a, 240b, 242a, and 242b are segments of polysilicon at terminal portions of gate fingers 232 and 234. Gate contacts 240a, 240b, 242a, and 242b are wider than gate fingers 232 and 234. Gate contacts 240a, 240b, 242a, and 242b facilitate connecting electrical connectors, such as vias and routings, to gate fingers 232 and 234.

As shown in FIG. 5, stubs 236 and 238 of gate fingers 232 and 234 are segments of polysilicon wider than the remaining portions of gate fingers 232 and 234. In the present implementation, stubs 236 and 238 are situated at terminal portions of gate fingers 232 and 234 near gate contacts 240a and 242a. In the present implementation, stubs 236 and 238 face towards one another as shown in FIG. 5. In various implementations, stubs 236 and 238 can be situated near gate contacts 240b and 242b instead of, or in addition to near gate contacts 240a and 242a. In the present implementation, stubs 236 and 238 are wider than the remaining portions of gate fingers 232 and 234, but narrower than gate contacts 240a, 240b, 242a, and 242b. In various implementations, stubs 236 and 238 may have any other dimensions relative to gate contacts 240a, 240b, 242a, and 242b. In various implementations, gate fingers 232 and 234, gate contacts 240a, 240b, 242a, and 242b, and stubs 236 and 238 can have various shapes or dimensions other than those shown in FIG. 5.

Figure 6:
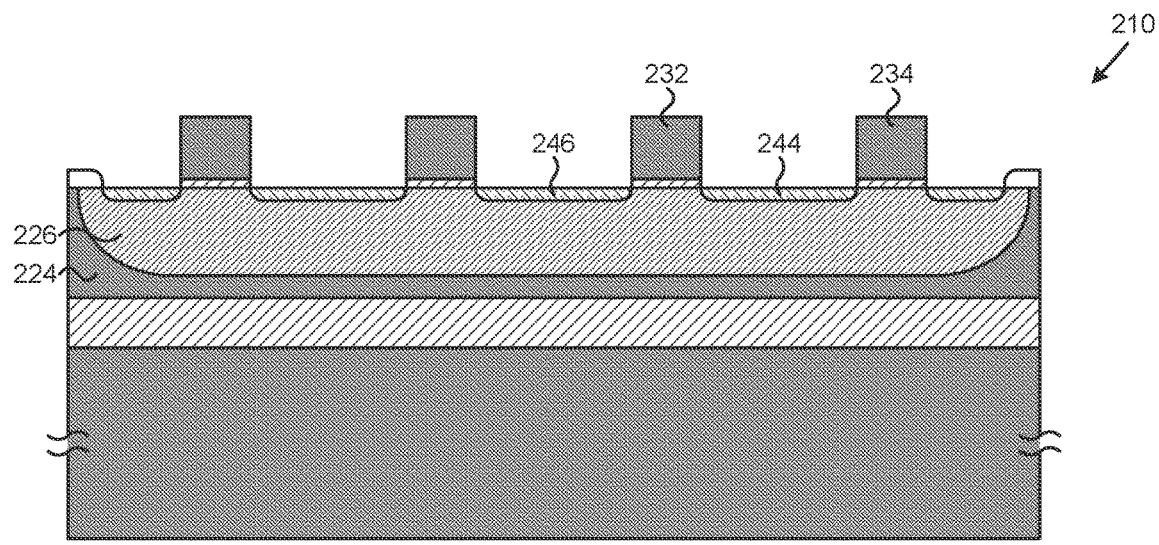
FIG. 6 illustrates a portion of an SOI device structure processed in accordance with action 110 in the flowchart of FIG. 1 according to one implementation of the present application.

FIG. 6 illustrates a portion of an SOI device structure processed in accordance with action 110 in the flowchart of FIG. 1 according to one implementation of the present application. As shown in FIG. 6, in SOI device structure 210, lightly-doped source regions 244 and lightly-doped drain regions 246 are formed in transistor body 226, between gate fingers 232 and 234.

Lightly-doped source regions 244 and lightly-doped drain regions 246 have a second conductivity type opposite to the first conductivity type. Continuing the above example, where transistor body 226 has P type conductivity, lightly-doped source regions 244 and lightly-doped drain regions 246 can be implanted with phosphorus or another appropriate N type dopant. As known in the art, lightly-doped source regions 244 and lightly-doped drain regions 246 can be regions having lower dopant concentration than subsequently formed source regions and drain regions (not shown in FIG. 6). Lightly-doped source regions 244 and lightly-doped drain regions 246 can be formed by an implant normal to the top surface of semiconductor layer 224, such that lightly-doped source regions 244 and lightly-doped drain regions 246 are substantially aligned with gate fingers 232 and 234, excepting small regions that may diffuse under gate fingers 232 and 234. Lightly-doped source regions 244 and lightly-doped drain regions 246 can have a relatively low implantation energy, such that they are relatively shallow in transistor body 226.

Figure 7:
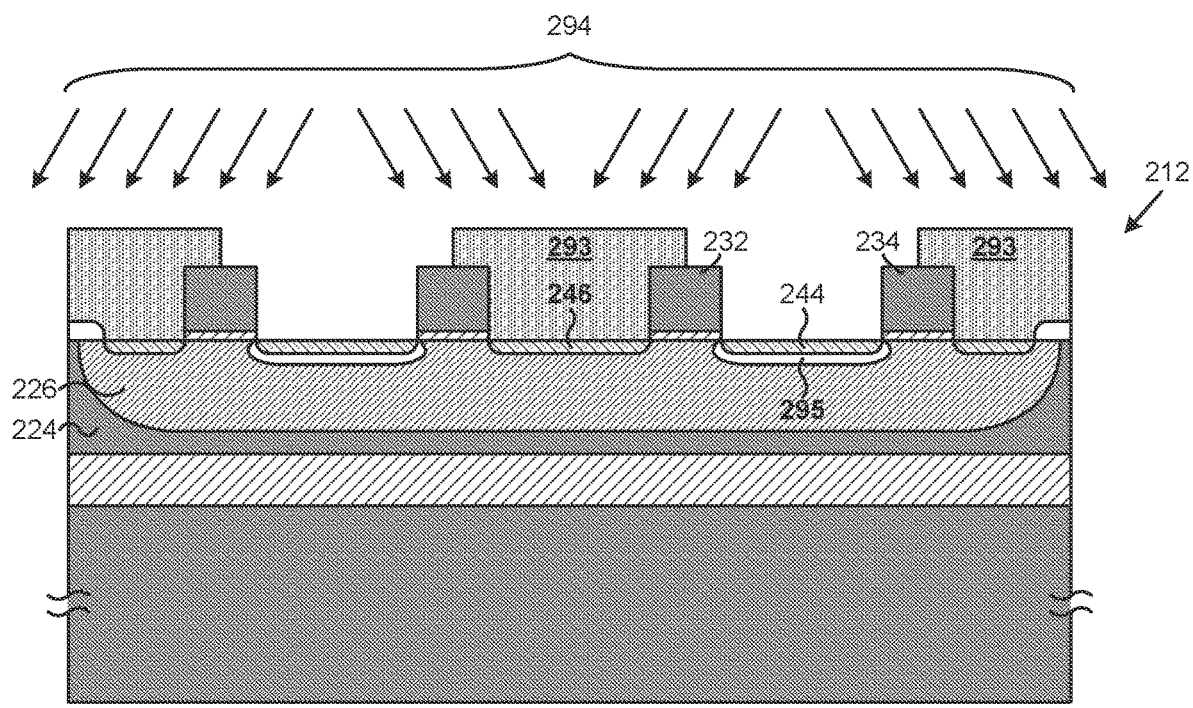
FIG. 7 illustrates a portion of an SOI device structure processed in accordance with action 112 in the flowchart of FIG. 1 according to one implementation of the present application.

FIG. 7 illustrates a portion of an SOI device structure processed in accordance with action 112 in the flowchart of FIG. 1 according to one implementation of the present application. As shown in FIG. 7, in SOI device structure 212, asymmetric mask 293 is formed over lightly-doped drain regions 246, and asymmetric halo-implant regions 295 are formed under lightly-doped source regions 244 in transistor body 226.

Asymmetric mask 293 may be any implant mask known in the art. Asymmetric mask 293 is asymmetric in that it has openings over lightly-doped source regions 244, but does not have openings over counterpart lightly-doped drain regions 246. Thus, lightly-doped source regions 244 are exposed to halo implant 294, which forms asymmetric halo-implant regions 295.

Asymmetric halo-implant regions 295 have the first conductivity type. Continuing the above example, where transistor body 226 has P type conductivity, and lightly-doped source regions 244 and lightly-doped drain regions 246 have N type conductivity, asymmetric halo-implant regions 295 can be implanted with boron or another appropriate P type dopant. In the present implementation, asymmetric halo-implant regions 295 are situated under lightly-doped source regions 244. Halo implant 294 utilized to form asymmetric halo-implant regions 295 may have a lower dopant concentration and higher implant energy than an implant utilized to form lightly-doped source regions 244. For example, if lightly-doped source regions 244 have a dopant concentration of approximately $1.0*10^{14}/cm^3$, asymmetric halo-implant regions 295 can have a dopant concentration of approximately $1.0*10^{13}/cm^3$.

Halo implant 294 is an implant angled away from the direction normal to the top surface of semiconductor layer 224. In various implementations, halo implant 294 may be angled approximately thirty degrees (30°) from the direction normal to the top surface of semiconductor layer 224, or greater or less. Thus, asymmetric halo-implant regions 295 have a different profile compared to lightly-doped source regions 244 or subsequently formed source regions (not shown in FIG. 7). For example, asymmetric halo-implant regions 295 may have a substantially elliptical or halo-shaped profile, rather than a substantially rectangular or rounded-rectangular profile. In order to form asymmetric halo-implant regions 295 under both sides of lightly-doped source regions 244, in one implementation, halo implant 294 may maintain a fixed angle while SOI device structure 212 may be rotated. In another implementation, halo implant 294 may comprise two implants performed at angles mirrored horizontally in FIG. 7. In one implementation, asymmetric mask 293 may have angled edges which complement halo implant 294. As shown in FIG. 7, asymmetric halo-implant regions 295 may also be situated partially under gate fingers 232 and 234.

Figure 8:
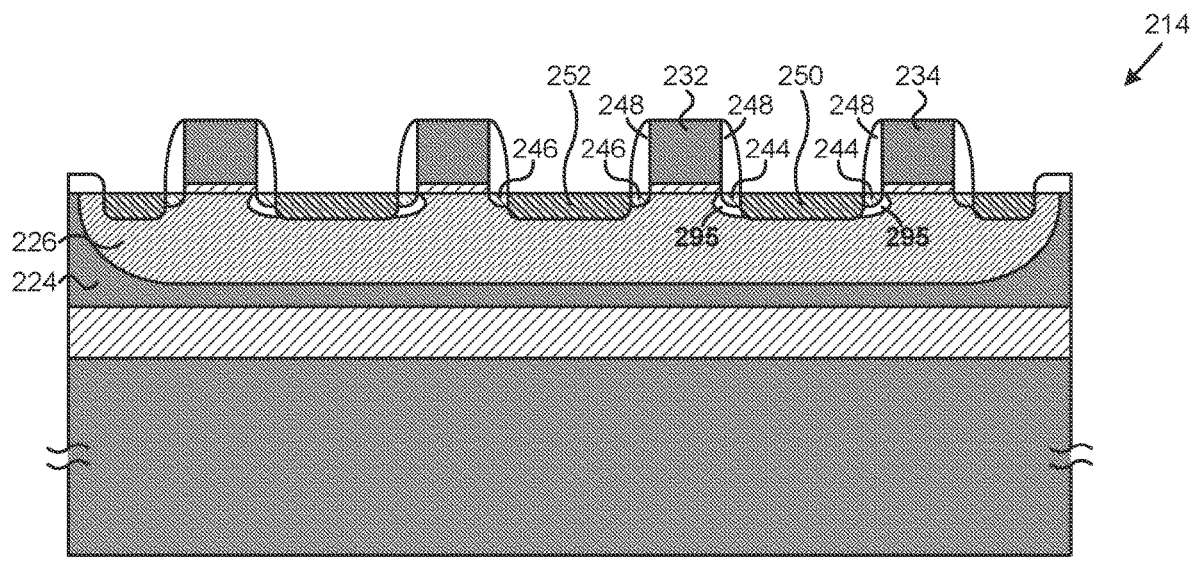
FIG. 8 illustrates a portion of an SOI device structure processed in accordance with action 114 in the flowchart of FIG. 1 according to one implementation of the present application.

FIG. 8 illustrates a portion of an SOI device structure processed in accordance with action 114 in the flowchart of FIG. 1 according to one implementation of the present application. As shown in FIG. 8, in SOI device structure 214, spacer dielectrics 248 are formed on sides of gate fingers 232 and 234 and over asymmetric halo-implant regions 295, and source regions 250 and drain regions 252 are formed in transistor body 226, where source regions 250 adjoin asymmetric halo-implant regions 295.

Spacer dielectrics 248 can comprise, for example, silicon nitride (SiN). Spacer dielectrics 248 can be formed, for example, by a conformal CVD deposition followed by removal of select portions over and between gate fingers 232 and 234. As a result, spacer dielectrics 248 can be situated on sides of gate fingers 232 and 234, separating gate fingers 232 and 234 from source regions 250 and drain regions 252. In the present implementation, spacer dielectrics 248 are formed after lightly-doped source regions 244 and lightly-doped drain regions 246, but before source regions 250 and drain regions 252. Thus, lightly-doped source regions 244 and lightly-doped drain regions 246 are substantially aligned with gate fingers 232 and 234, while source regions 250 and drain regions 252 are substantially aligned with spacer dielectrics 248, excepting small regions that may diffuse.

Source regions 250 and drain regions 252 have the second conductivity type opposite to the first conductivity type. Continuing the above example, where transistor body 226 and asymmetric halo-implant regions 295 have P type conductivity, and lightly-doped source regions 244 and lightly-doped drain regions 246 have N type conductivity, source regions 250 and drain regions 252 can be implanted with phosphorus or another appropriate N type dopant. Source regions 250 and lightly-doped source regions 244 together function as a transistor source. Likewise, drain regions 252 and lightly-doped drain regions 246 together function as a transistor drain. As known in the art, source regions 250 and drain regions 252 can be regions having higher dopant concentration than lightly-doped source regions 244 and lightly-doped drain regions 246. Source regions 250 and drain regions 252 can also have a higher implantation energy, such that source regions 250 and drain regions 252 extend deeper into transistor body 226. Source regions 250 and drain regions 252 can be formed by an implant normal to the top surface of semiconductor layer 224.

Notably, asymmetric halo-implant regions 295 adjoin source regions 250, but no halo-implant regions adjoin counterpart drain regions 252. Thus, halo-implant regions 295 are referred to as "asymmetric" in the present application. Asymmetric halo-implant regions 295 are also situated under spacer dielectrics 248 of gate fingers 232 and 234 neighboring source regions 250. Asymmetric halo-implant regions 295 provide improved gain and linearity to SOI transistors according implementations of the present application, as described further below.

In the implementation of FIG. 8, asymmetric halo-implant regions 295 are illustrated as extending vertically from the top surface of semiconductor layer 224 to a depth between lightly-doped source regions 244 and source regions 250, and extending laterally from edges of source regions 250 to a width under gate fingers 232 and 234. In various implementations, asymmetric halo-implant regions 295 may have any other shapes or dimensions as they adjoin source regions 250. For example, in one implementation, uppermost portions of asymmetric halo-implant regions 295 may be between the top surface of semiconductor layer 224 and bottom portions of lightly-doped source regions 244. In another implementation, lowermost portions of asymmetric halo-implant regions 295 may be below source regions 250. In yet another implementation, lightly-doped source regions 244 and lightly-doped drain regions 246 may be optional.

The following disclosures in FIGS. 9A through 11D generally correspond to actions 116 and 118 in FIG. 1, and pertain to exemplary techniques for electrically tying a transistor body (such as transistor body 226 in FIG. 8) to a source region (such as one of source regions 250 in FIG. 8) according to the present application. However, it is noted that other techniques may be employed for electrically tying a transistor body to a source region, such as a dedicated transistor body contact, or "T" shaped or "H" shaped gate structures.

Figure 9A:
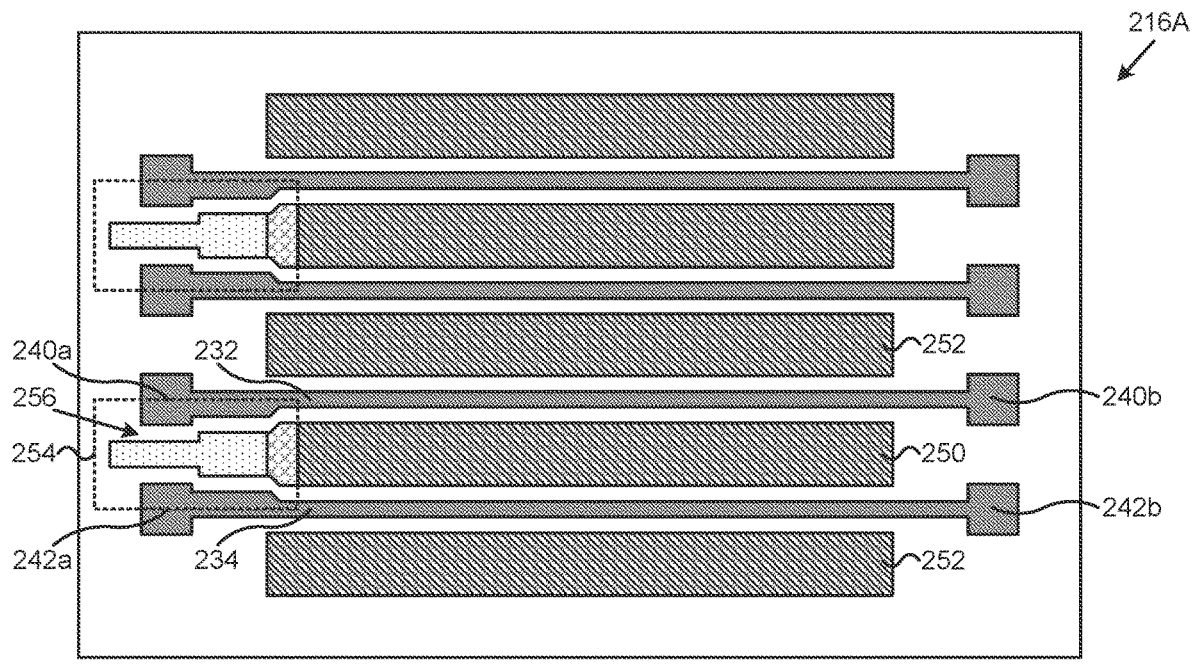
FIG. 9A illustrates a portion of an SOI device structure processed in accordance with action 116 in the flowchart of FIG. 1 according to one implementation of the present application.

FIG. 9A illustrates a portion of an SOI device structure processed in accordance with action 116 in the flowchart of FIG. 1 according to one implementation of the present application. As shown in FIG. 9A, in SOI device structure 216A, heavily-doped body-implant regions 256 are formed overlapping source regions 250. Heavily-doped body-implant regions 256 are situated partially outside source regions 250 and near gate contacts 240a and 242a. Mask openings 254 show regions where openings may be defined in an exemplary mask, such that an implant can form heavily-doped body-implant regions 256 in transistor body 226 (shown in FIG. 8) and overlapping source regions 250.

Heavily-doped body-implant regions 256 have the first conductivity type.

Continuing the above example, where transistor body 226 (shown in FIG. 8) has P type conductivity and source regions 250 and drain regions 252 have N type conductivity, heavily-doped body-implant regions 256 can be implanted with boron or another appropriate P type dopant. Heavily-doped body-implant regions 256 have a significantly higher dopant concentration compared to transistor body 226. For example, if transistor body 226 has a dopant concentration of approximately $1.0*10^{17}/cm^3$, heavily-doped body-implant regions 256 can have a dopant concentration of approximately $1.0*10^{20}/cm^3$.

Figure 9B:
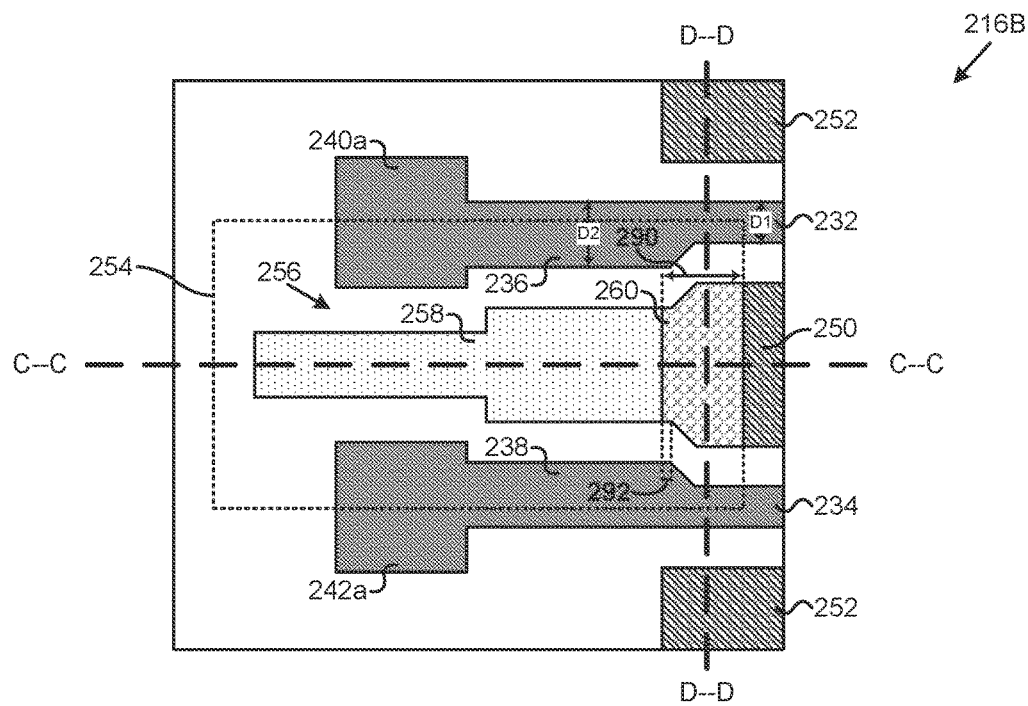
FIG. 9B illustrates a top view of a portion of an SOI device structure corresponding to the SOI device structure of FIG. 9A according to one implementation of the present application.

FIG. 9B illustrates a top view of a portion of an SOI device structure corresponding to the SOI device structure of FIG. 9A according to one implementation of the present application. As shown in FIG. 9B, heavily-doped body-implant regions 256 comprise body tie regions 258 and overlap regions 260. Body tie regions 258 represent portions of heavily-doped body-implant regions 256 outside source regions 250. Overlap regions 260 represent portions of heavily-doped body-implant regions 256 overlapping source regions 250. The overlap distance 290 of overlap region 260 can be tuned to optimize the performance of SOI device structure 216B.

As described above, mask openings 254 show regions where openings may be defined in an exemplary mask, such that an implant can form heavily-doped body-implant regions 256 in transistor body 226 (shown in FIG. 8) and overlapping source regions 250. For example, mask region 254 can have boundaries approximately aligned over midpoints of gate fingers 232 and 234 (i.e., halfway along dimension D1), and overlapping source regions 250 by more than a minimum process rule, as shown in FIG. 9B. Thus, an implant can reliably form heavily-doped body-implant regions 256 across transistor body 226 (shown in FIG. 8) between gate fingers 232 and 234 and/or between spacer dielectrics 248 (shown in FIG. 8), and overlapping source regions 250, while providing some tolerance for misalignment, and avoiding overlapping drain regions 252.

As further shown in FIG. 9B, heavily-doped body-implant regions 256 are formed overlying and/or adjacent to stubs 236 and 238 of gate fingers 232 and 234. Stubs 236 and 238 face each other as described above. Stubs 236 and 238 have tapered portions that gradually narrow from width D2 to width D1. In the present implementation, stubs 236 and 238 taper from the greater width D2 to the smaller width D1 using a slanted portion at a taper angle of about forty five degrees (45°). In various implementations, a taper angle greater than or less than forty five degrees (45°) may be used. The wider portions of stubs 236 and 238 can be overplotted beyond source regions 250. For example, as shown in FIG. 9B, width D2 of stubs 236 and 238 is maintained, i.e. is overplotted, relative to source regions 250 by overplot distance 292, before stubs 236 and 238 begin to taper. The overplot distance 292 of stubs 236 and 238 can be tuned to optimize the performance of SOI transistor structure 216B. Spacer dielectrics 248 (shown in FIG. 8), heavily-doped body-implant regions 256, and source regions 250 may roughly mirror the contours of gate contacts, 240a and 242a, stubs 236 and 238, and gate fingers 232 and 234.

Figure 9C:
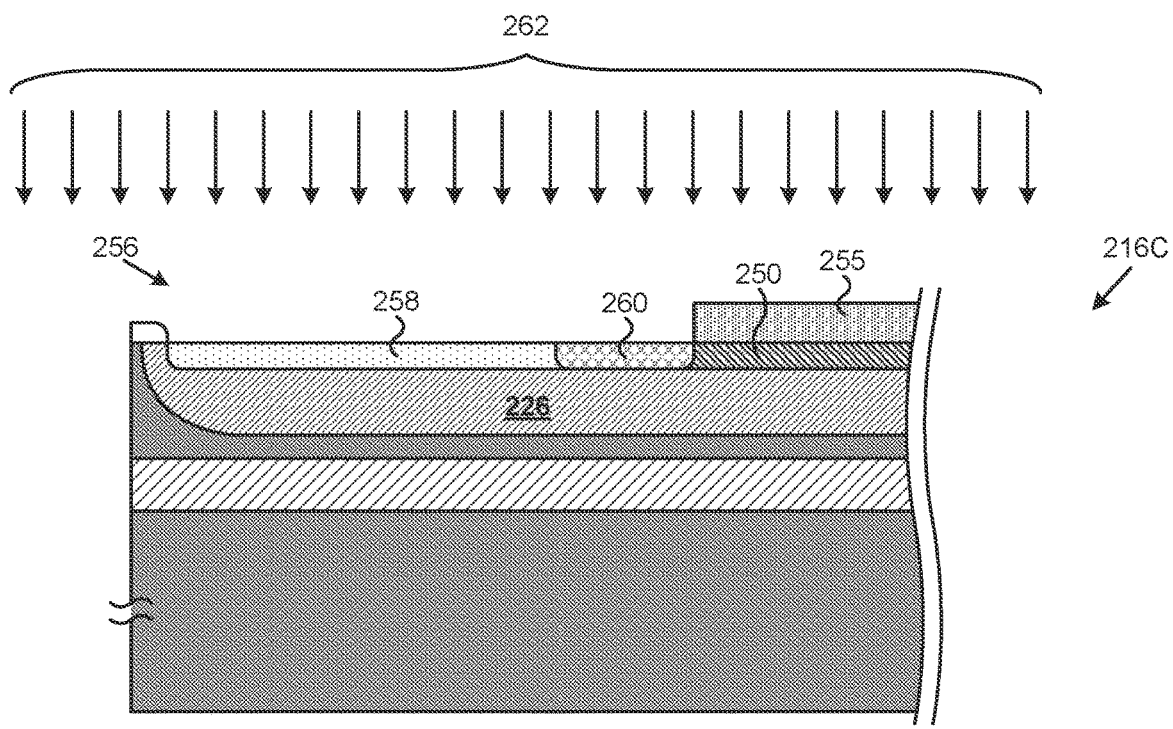
FIG. 9C illustrates a cross-sectional view of a portion of an SOI device structure corresponding to the SOI device structure of FIG. 9B according to one implementation of the present application.

FIG. 9C illustrates a cross-sectional view of a portion of an SOI device structure corresponding to the SOI device structure of FIG. 9B according to one implementation of the present application. FIG. 9C represents a cross-section along line "C-C" in FIG. 9B. As shown in FIG. 9C, SOI transistor structure 216C includes transistor body 226, heavily-doped body-implant regions 256 comprising body tie regions 258 and overlap regions 260, source regions 250, mask 255, and implant 262. In the present implementation, implant 262 is a highly concentrated P type implant. Mask 255 may be any implant mask known in the art. Mask 255 is bordered by mask openings 254 in FIGS. 9A and 9B. Mask opening 254 leaves outer portions of source regions 250 unmasked and thus exposed to implant 262. As such, implant 262 forms heavily-doped body-implant regions 256 comprising body tie regions 258 and overlap regions 260. Notably, heavily-doped body-implant regions 256 are heavily doped with the same conductivity type as transistor body 226 and create good electrical connections to transistor body 226.

Figure 9D:
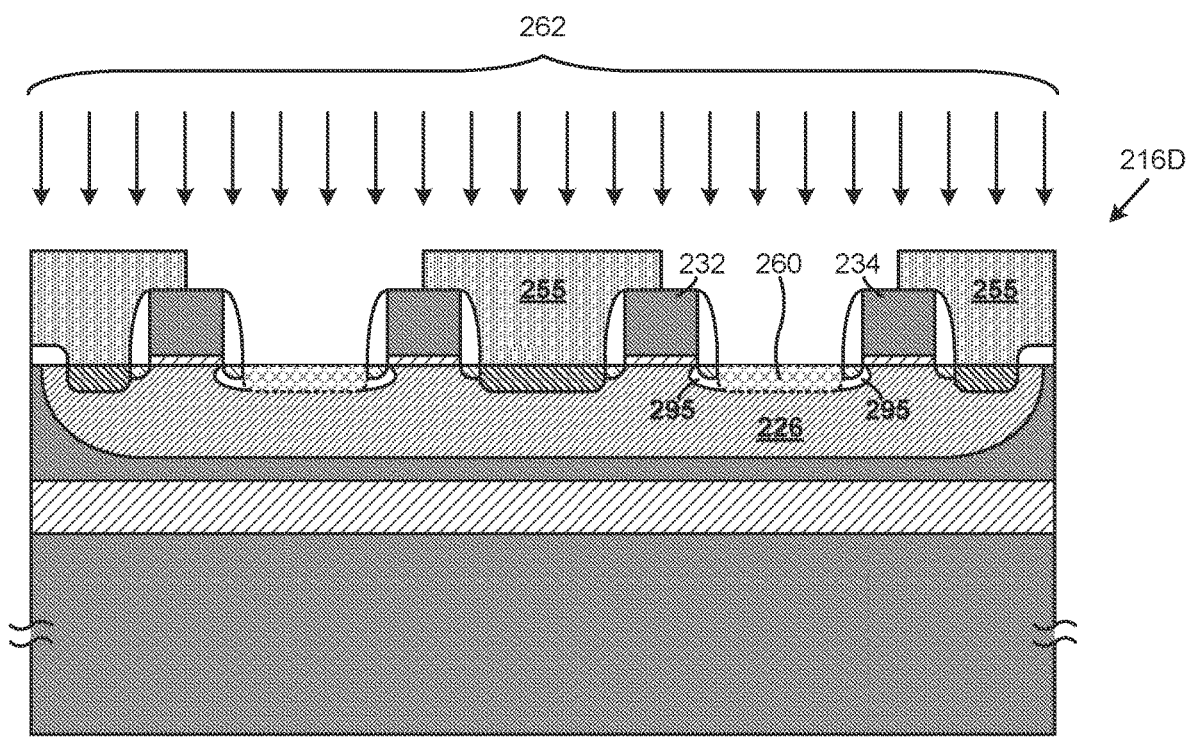
FIG. 9D illustrates a cross-sectional view of a portion of an SOI device structure corresponding to the SOI device structure of FIG. 9B according to one implementation of the present application.

FIG. 9D illustrates a cross-sectional view of a portion of an SOI device structure corresponding to the SOI device structure of FIG. 9B according to one implementation of the present application. FIG. 9D represents a cross-section along line "D-D" in FIG. 9B. As shown in FIG. 9D, SOI transistor structure 216D includes transistor body 226, overlap regions 260, asymmetric halo-implant regions 295, gate fingers 232 and 234, mask 255, and implant 262. Mask 255 is bordered by mask openings 254 in FIGS. 9A and 9B. As described above, mask opening 254 can have boundaries approximately aligned over midpoints of gate fingers 232 and 234. Asymmetric halo-implant regions 295 adjoin overlap regions 260 of heavily-doped body-implant regions 256 (shown in FIG. 9C). Notably, because overlap regions 260 of heavily-doped body-implant regions 256 (shown in FIG. 9C) are heavily doped with the same conductivity type as transistor body 226 and asymmetric halo-implant regions 295, overlap regions 260 create good electrical connections to transistor body 226 and asymmetric halo-implant regions 295.

Figure 10A:
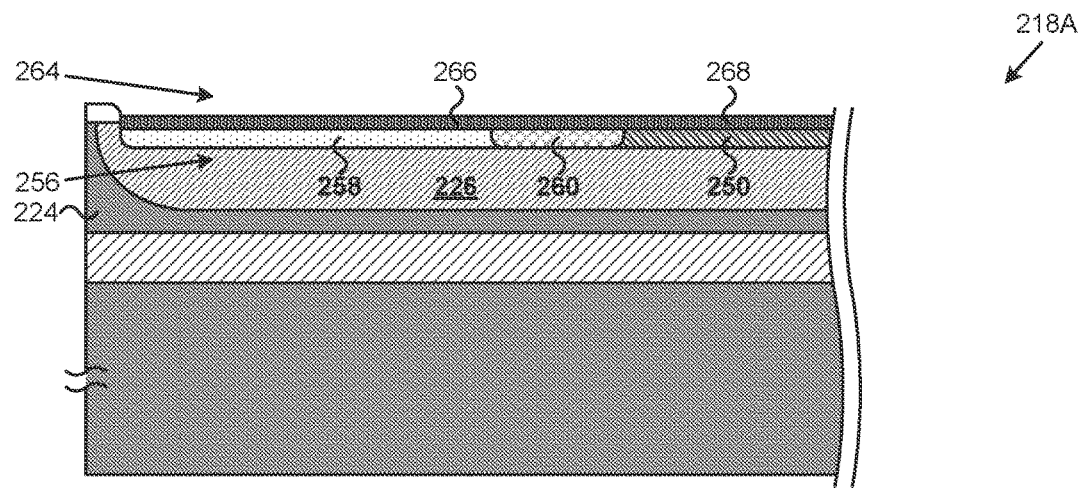
FIG. 10A illustrates a portion of an SOI device structure processed in accordance with action 118 in the flowchart of FIG. 1 according to one implementation of the present application.
Figure 10B:
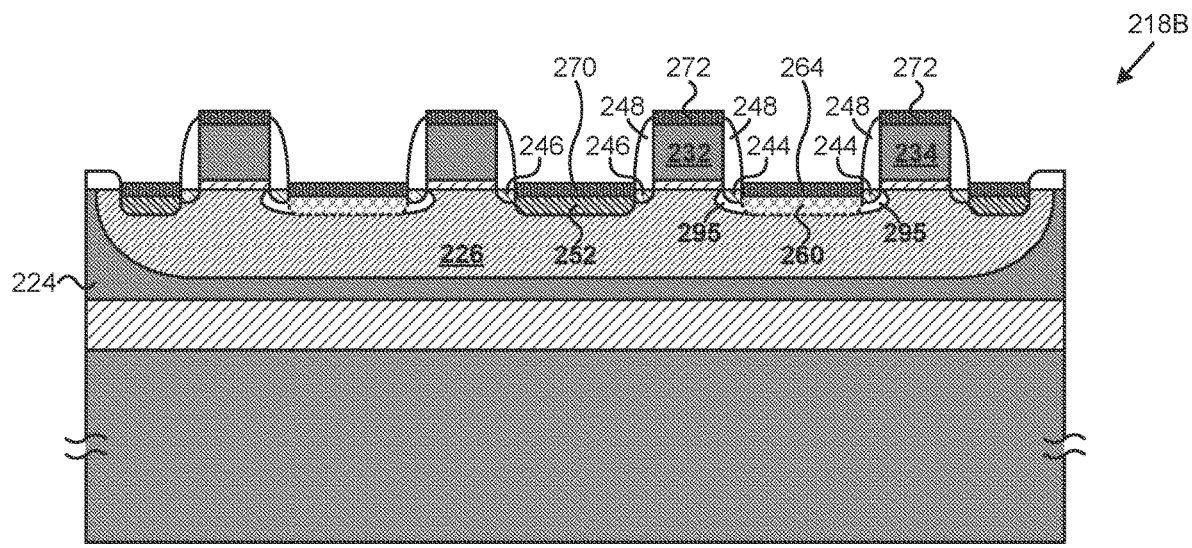
FIG. 10B illustrates a cross-sectional view of a portion of an SOI device structure corresponding to the SOI device structure of FIG. 10A according to one implementation of the present application.

FIG. 10A illustrates a portion of an SOI device structure processed in accordance with action 118 in the flowchart of FIG. 1 according to one implementation of the present application. FIG. 10B illustrates a cross-sectional view of a portion of an SOI device structure corresponding to the SOI device structure of FIG. 10A according to one implementation of the present application. As shown in FIGS. 10A and 10B, in SOI device structures 218A and 218B, common silicided regions 264 are fabricated to form a robust and a very low resistance electrical connection, i.e. to electrically tie heavily-doped body-implant regions 256 and transistor body 226 to source regions 250. Common silicided regions 264 include body tie silicided regions 266 and source silicided regions 268. Body tie silicided regions 266 overlie both body tie regions 258 and overlap regions 260. Source silicided regions 268 overlie source regions 250.

In order to form common silicided regions 264 in FIGS. 10A and 10B, mask 255 (shown in FIGS. 9C and 9D) can be removed, then a siliciding layer can be deposited over various SOI transistor structures 216C and 216D (shown in FIGS. 9C and 9D) by sputtering. In various implementations, the siliciding layer may be, nickel (Ni), cobalt (Co), platinum (Pt), or an alloy thereof. Then a thermal anneal can be performed to cause the siliciding layer to react with heavily-doped body-implant regions 256 and source regions 250, creating common silicided regions 264 a few hundred angstroms deep. As shown particularly in FIG. 10B, the siliciding layer will also react with drain regions 252 and gate fingers 232 and 234, creating drain silicided regions 270 and gate silicided regions 272. Then unreacted portions of the siliciding layer can be removed, resulting in SOI device structures 218A and 218B. It is noted that spacer dielectrics 248 do not react during the silicidation process and are thus not silicided. As such, spacer dielectrics 248 are utilized to separate and insulate various silicided regions from unintentionally shorting to each other.

Common silicided regions 264 are highly conductive. As a result, heavily-doped body-implant regions 256 are electrically tied to source regions 250. Heavily-doped body-implant regions 256 also create good electrical connections to transistor body 226 and asymmetric halo-implant regions 295. Thus, source regions 250 and heavily-doped body-implant regions 256 can achieve the same electrical potential as transistor body 226 and/or asymmetric halo-implant regions 295. Moreover, a dedicated contact is not needed for transistor body 226.

As stated above, spacer dielectrics 248 will not react with a siliciding layer. Because spacer dielectrics 248 are situated on sides of gate fingers 232 and 234, source silicided regions 268 of common silicided regions 264 are separated from drain silicided regions 270 by spacer dielectrics 248 and gate fingers 232 and 234. Thus, gate fingers 232 and 234 and drain silicided regions 270 will not be electrically shorted to source regions 250, and by extension, will not be electrically shorted to heavily-doped body-implant regions 256 and transistor body 226.

In one implementation, SOI device structures 218A and 218B represent an N type field effect transistor (NFET); source regions 250 and drain regions 252 and lightly-doped source regions 244 and lightly-doped drain regions 246 are N type, and heavily-doped body-implant regions 256, transistor body 226, and asymmetric halo-implant regions 295 are P type. In other implementations, SOI device structures 218A and 218B represent a P type field effect transistor (PFET), and the conductivity types are reversed.

SOI device structures 218A and 218B represent a substantially completed SOI transistor. However, SOI device structures 218A and 218B can also include additional elements not shown in FIGS. 10A and 10B. For example, a multi-layer stack of metallizations and interlayer dielectrics can be situated over SOI device structures 218A and 218B to create connections to common silicided regions 264, drain silicided regions 270, and gate silicided regions 272. SOI device structures 218A and 218B can also include other semiconductor devices. For example, semiconductor layer 224 can include other active devices, such as FETs. As another example, passive devices, such as inductors and capacitors, can be integrated in semiconductor layer 224 or in an overlying multi-layer stack. As yet another example, SOI device structures 218A and 218B can be an integrated low noise amplifier (LNA) chip or power amplifier (PA) chip that includes the SOI transistor portion shown in FIGS. 10A and 10B.

Figure 11A:
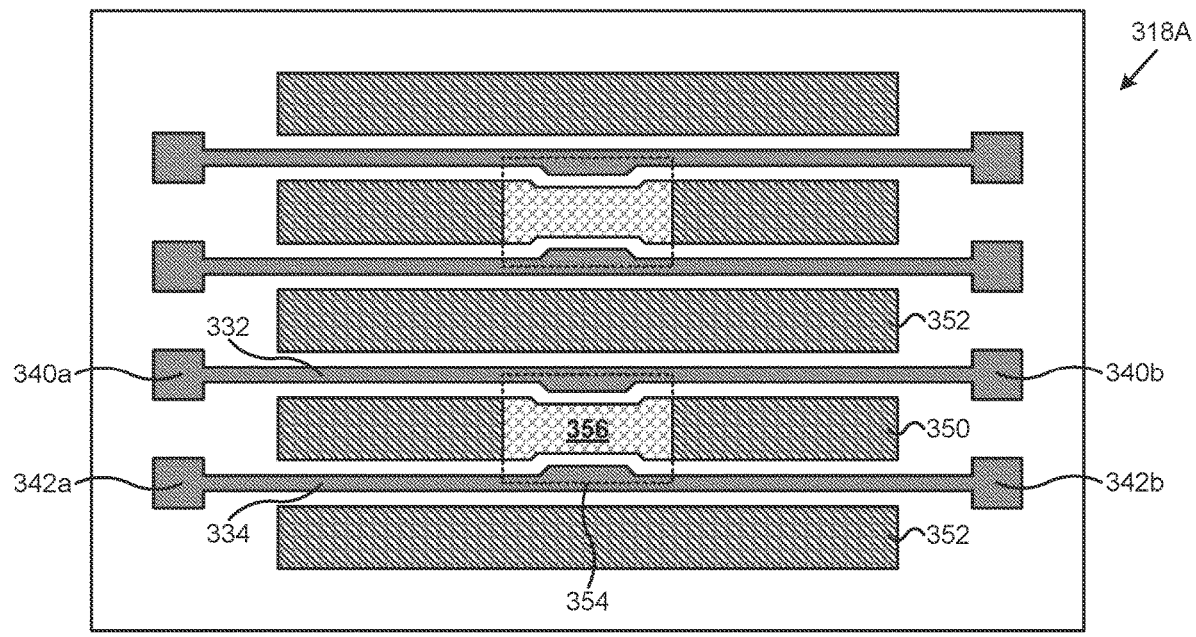
FIG. 11A illustrates a top view of a portion of an SOI device structure processed according to one implementation of the present application.
Figure 11B:
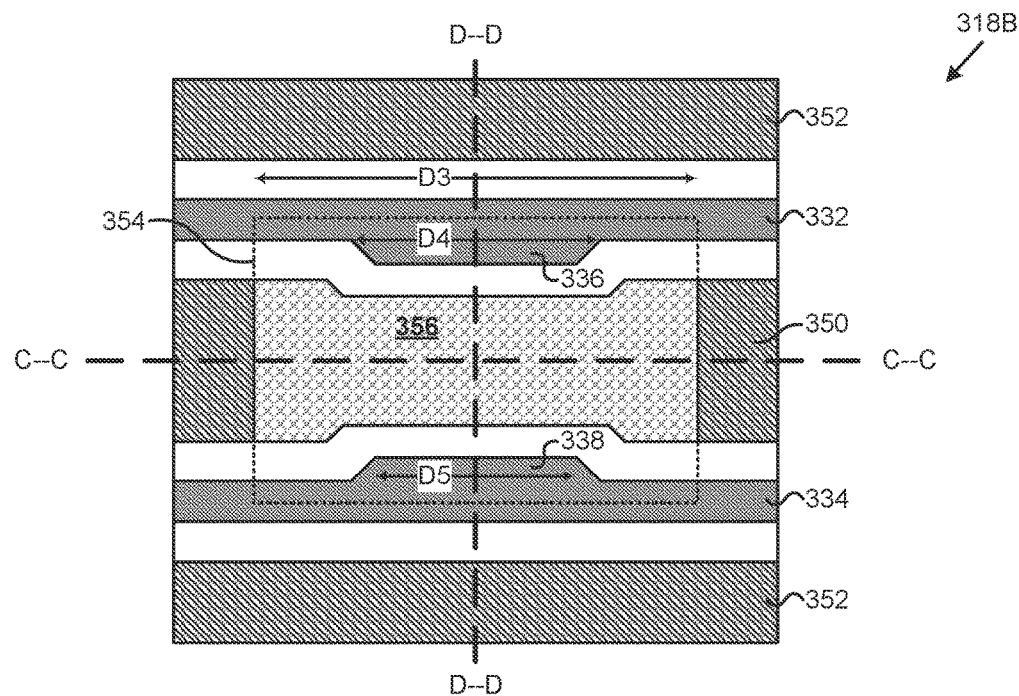
FIG. 11B illustrates a top view of a portion of an SOI device structure corresponding to the SOI device structure of FIG. 11A according to one implementation of the present application.

FIG. 11A illustrates a top view of a portion of an SOI device structure processed according to one implementation of the present application. FIG. 11B illustrates a top view of a portion of an SOI device structure corresponding to the SOI device structure of FIG. 11A according to one implementation of the present application. SOI device structures 318A and 318B in FIGS. 11A and 11B represent an alternative implementation to SOI device structures 216A and 216B in FIGS. 9A and 9B. Except for differences noted below, gate fingers 332 and 334 including stubs 336 and 338, gate contacts 340a, 340b, 342a, and 342b, source regions 350, drain regions 352, mask openings 354, and heavily-doped body-implant regions 356 in FIGS. 11A and 11B generally correspond to gate fingers 232 and 234 including stubs 236 and 238, gate contacts 240a, 240b, 242a, and 242b, source regions 250, drain regions 252, mask openings 254, and heavily-doped body-implant regions 256 in FIGS. 9A and 9B.

As shown in FIG. 11A, in SOI device structure 318A, heavily-doped body-implant regions 356 are formed overlapping source regions 350. Heavily-doped body-implant regions 356 are situated inside source regions 350 and near centers of gate fingers 332 and 334. Mask openings 354 show regions where openings may be defined in an exemplary mask, such that an implant can form heavily-doped body-implant regions 356 overlapping source regions 350. Heavily-doped body-implant regions 356 may be formed in a similar manner as described above with reference to action 116 in FIG. 1 and with reference to heavily-doped body-implant regions 256 in FIGS. 9A through 9D, albeit utilizing different mask openings and dimensions.

As shown in FIG. 11B, and in contrast to FIG. 9B, heavily-doped body-implant regions 356 entirely overlap source regions 350 within mask openings 354. Dimension D3 of heavily-doped body-implant regions 356 can be tuned to optimize the performance of SOI device structure 318B. As further shown in FIG. 11B, heavily-doped body-implant regions 356 are formed adjacent to stubs 336 and 338 of gate fingers 332 and 334. In the present implementation, stubs 336 and 338 are situated at or near centers of gate fingers 332 and 334, away from gate contacts gate contacts 340a, 340b, 342a, and 342b. Stubs 336 and 338 face each other and face away from drain regions 352. Stubs 336 and 338 have tapered portions and are substantially trapezoidal in the present example. At the base of the trapezoid, stubs 336 and 338 have dimension D4. At the tip of the trapezoid, stubs 336 and 338 have dimension D5. In one implementation, dimension D4 may be approximately four hundred nanometers (400 nm), and dimension D5 may be approximately two hundred nanometers (200 nm). In the present implementation, stubs 336 and 338 have a taper angle of about forty-five degrees (45°). In various implementations, stubs 336 and 338 may have other shapes, dimensions, or taper angles.

Figure 11C:
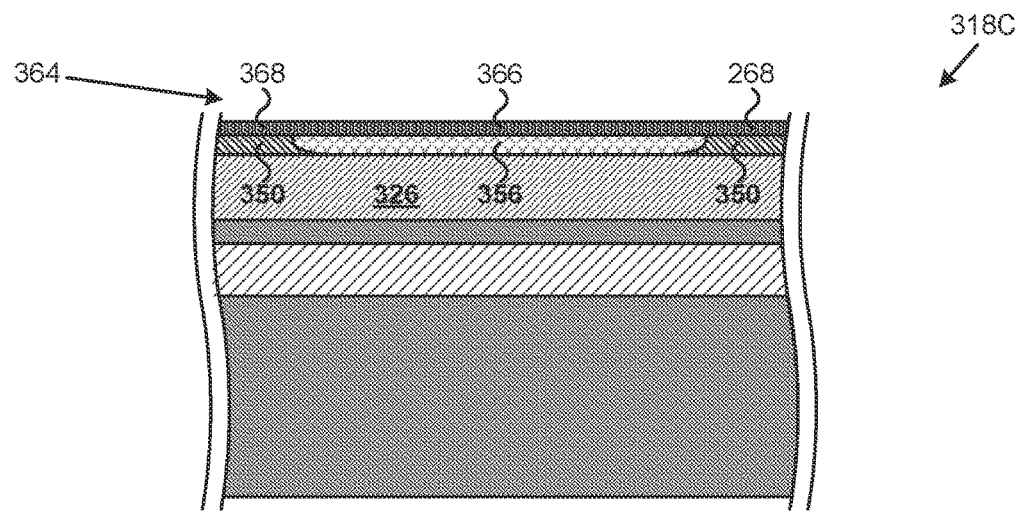
FIG. 11C illustrates a cross-sectional view of a portion of an SOI device structure corresponding to the SOI device structure of FIG. 11B according to one implementation of the present application.
Figure 11D:
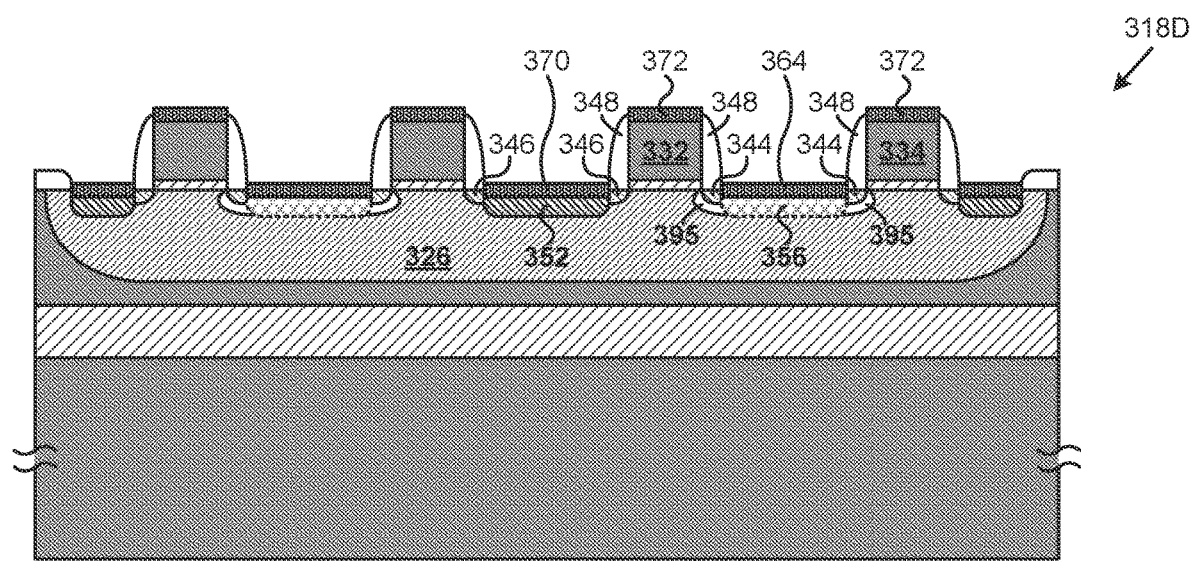
FIG. 11D illustrates a cross-sectional view of a portion of an SOI device structure corresponding to the SOI device structure of FIG. 11B according to one implementation of the present application.

FIG. 11C illustrates a cross-sectional view of a portion of an SOI device structure corresponding to the SOI device structure of FIG. 11B according to one implementation of the present application. FIG. 11C represents a cross-section along line "C-C" in FIG. 11B, after formation of common silicided regions 364. FIG. 11D illustrates a cross-sectional view of a portion of an SOI device structure corresponding to the SOI device structure of FIG. 11B according to one implementation of the present application. FIG. 11D represents a cross-section along line "D-D" in FIG. 11B, after formation of common silicided regions 364, drain silicided regions 370, and gate silicided regions 372. As shown in FIGS. 11C and 11D, SOI device structures 318C and 318D include transistor body 326, gate fingers 332 and 334, spacer dielectrics 348, lightly-doped source regions 344, lightly-doped drain regions 346, source regions 350, drain regions 352, asymmetric halo-implant regions 395, heavily-doped body-implant regions 356, common silicided regions 364, drain silicided regions 370, and gate silicided regions 372.

Heavily-doped body-implant regions 356 are situated inside of and overlap source regions 350. Common silicided regions 364 include body tie silicided regions 366 and source silicided regions 368. Body tie silicided regions 366 overlie heavily-doped body-implant regions 356. Source silicided regions 368 overlie source regions 350. Common silicided regions 364, drain silicided regions 370, and gate silicided regions 372 may be formed in a similar manner as described above with reference to action 118 in FIG. 1 and with reference to common silicided regions 264, drain silicided regions 270, and gate silicided regions 272 in FIGS. 10A and 10B.

SOI transistor structures 318C and 318D electrically tie source regions 350, heavily-doped body-implant regions 356, and transistor body 326 without a dedicated contact. Heavily-doped body-implant regions 356 also create good electrical connections to asymmetric halo-implant regions 395. Gate fingers 332 and 334 and drain silicided regions 370 will not be electrically shorted to source regions 350, and by extension, will not be electrically shorted to heavily-doped body-implant regions 356 and transistor body 326. SOI transistor structures 318C and 318D in FIGS. 11C and 11D offer different tradeoffs between parasitics, effective channel width, and output resistance, compared to SOI device structures 218A and 218B in FIGS. 10A and 10B.

Figure 12A:
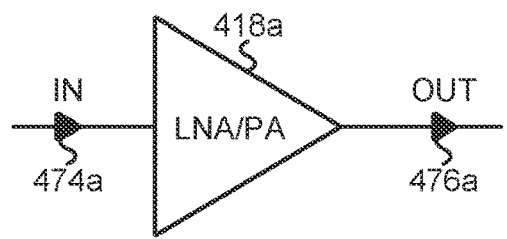
FIG. 12A illustrates a low-noise amplifier (LNA) or power amplifier (PA) according to one implementation of the present application.
Figure 12B:
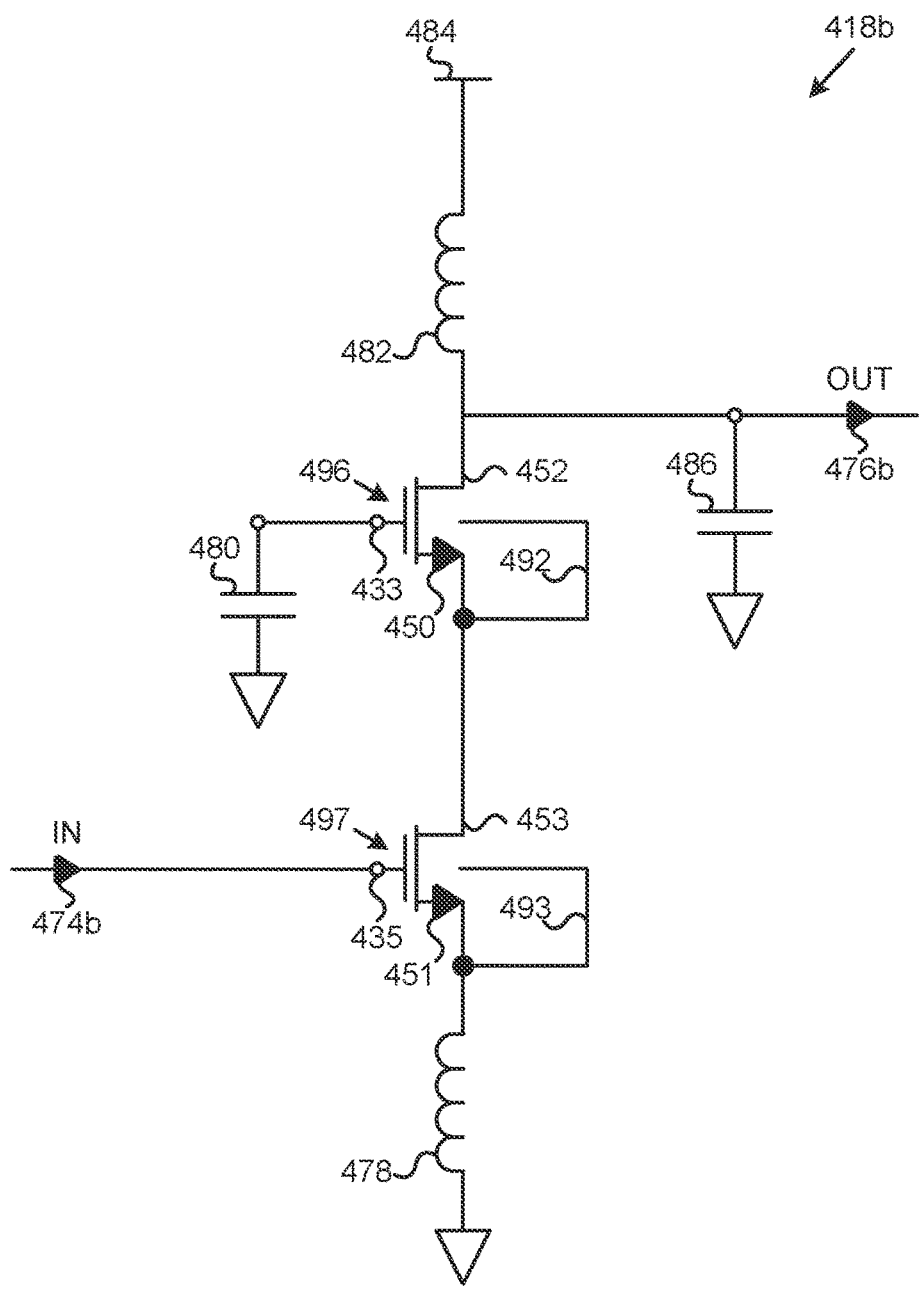
FIG. 12B illustrates a portion of an LNA circuit or a PA circuit corresponding to the LNA or PA of FIG. 12A and employing an SOI transistor according to one implementation of the present application.

FIG. 12A illustrates an LNA or PA according to one implementation of the present application. LNA/PA 418a amplifies electrical signals received at input 474a and provides the amplified electrical signals to output 476a. FIG. 12B illustrates a portion of an LNA circuit or a PA circuit corresponding to the LNA or PA of FIG. 12A and employing an SOI transistor according to one implementation of the present application.

As shown in FIG. 12B, LNA/PA circuit 418b includes input 474b, SOI transistor 496 including gate 433, source 450, and drain 452, SOI transistor 497, including gate 435, source 451, and drain 453, source inductance 478, gate capacitance 480, drain inductance 482, supply voltage 484, load capacitance 486, and output 476b. LNA/PA circuit 418b, input 474b, and output 476b in FIG. 12B generally correspond to LNA/PA 418a, input 474a, and output 476a in FIG. 12A. SOI transistors 496 and 497 generally correspond to SOI device structures 218A and 218B in FIGS. 10A and 10B, or to SOI device structures 318C and 318D in FIGS. 11C and 11D, and may have any implementations and advantages described above. As seen in FIG. 12B, transistor body 492 of SOI transistor 496 is electrically tied to its source 450, and transistor body 493 of SOI transistor 497 is electrically tied to its source 451.

Input 474b is coupled to gate 435 of SOI transistor 497. Source 451 of SOI transistor 497 is coupled to source inductance 478, which is coupled to ground. Drain 453 of SOI transistor 497 is coupled to source 450 of SOI transistor 496. Gate 433 of SOI transistor 496 is coupled to gate capacitance 480, which may represent a biasing voltage for SOI transistor 496. Drain 452 of SOI transistor 496 is coupled to drain inductance 482, which is coupled to supply voltage 484. Drain 452 of SOI transistor 496 is also coupled to output 476b and to load capacitance 486, which is coupled to ground.

LNA/PA circuit 418b employs cascoded SOI transistors 496 and 497 to achieve amplification. SOI transistor 496 may represent a "cascode stage," while SOI transistor 497 may represent a "gain stage," as known in the art. In general, a PA is preferably configured to optimize linearity over noise performance. Since the inventive SOI device structures 218A and 218B in FIGS. 10A and 10B and the inventive SOI device structures 318C and 318D in FIGS. 11C and 11D provide improved gain and linearity compared to conventional transistors, the inventive SOI device structures are particularly suitable for use as "gain stage" SOI transistor 497 where LNA/PA circuit 418b is implemented as a PA. In such implementation, "cascode stage" SOI transistor 496 may be replaced with a transistor specially designed for higher voltages.

In general, an LNA is preferably configured to optimize noise performance. Since the inventive SOI device structures 218A and 218B in FIGS. 10A and 10B and the inventive SOI device structures 318C and 318D in FIGS. 11C and 11D provide improved gain and linearity compared to conventional transistors, the inventive SOI device structures are particularly suitable for use as "cascode stage" SOI transistor 496 where LNA/PA circuit 418b is implemented as an LNA. In such implementation, "gain stage" SOI transistor 497 may be replaced with a transistor specially designed for low noise. Alternatively, since the inventive SOI device structures 218A and 218B in FIGS. 10A and 10B and the inventive SOI device structures 318C and 318D in FIGS. 11C and 11D provide improved gain and linearity without increased noise compared to conventional transistors, where LNA/PA circuit 418b is implemented as an LNA, both "cascode stage" SOI transistor 496 and "gain stage" SOI transistor 497 may employ the inventive SOI device structures.

Figure 13A:
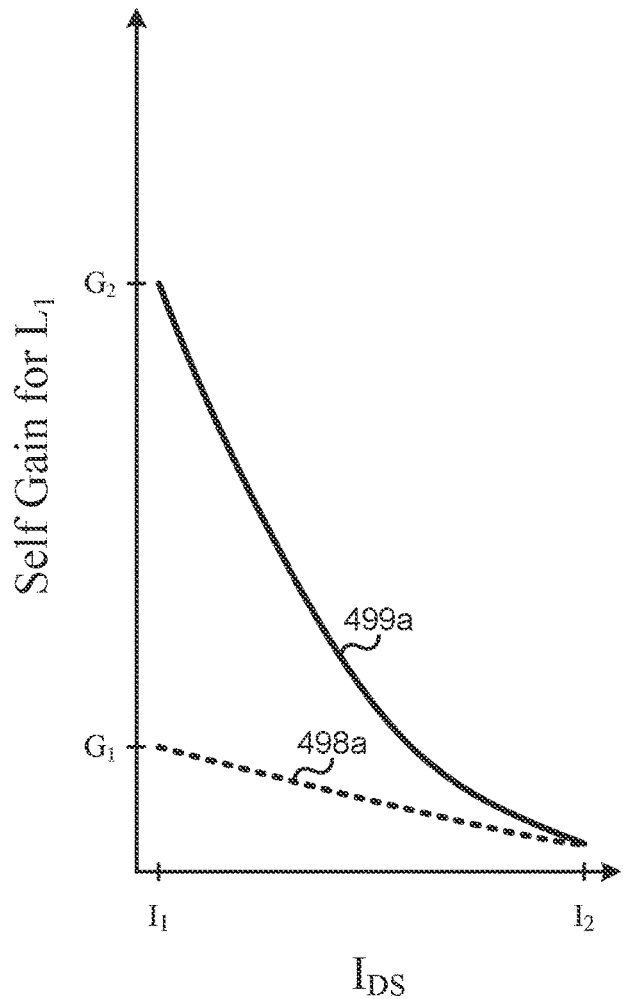
FIG. 13A illustrates an exemplary graph of transistor self gain versus transistor current ($I_{DS}$) according to one implementation of the present application.
Figure 13B:
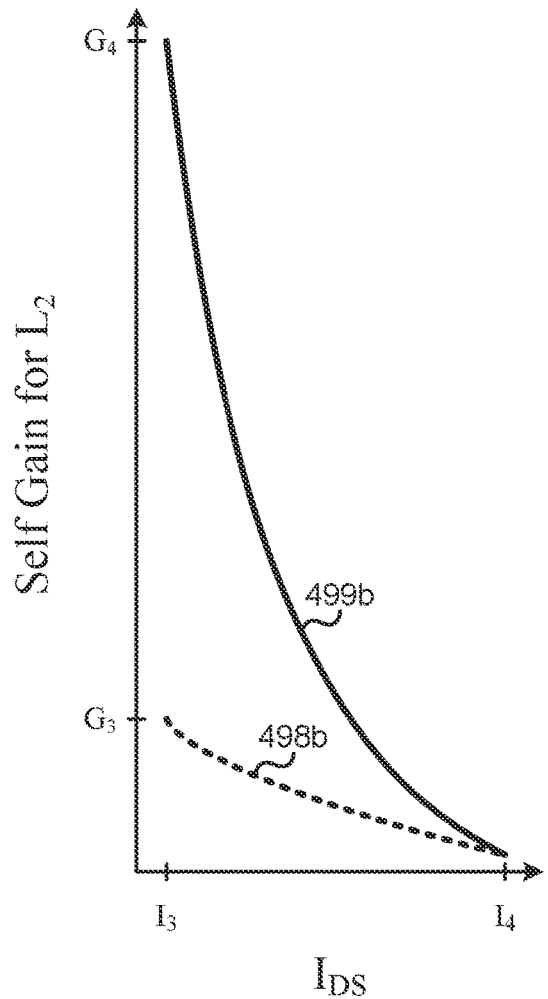
FIG. 13B illustrates an exemplary graph of transistor self gain versus transistor current ($I_{DS}$) according to one implementation of the present application.

FIGS. 13A and 13B each illustrate an exemplary graph of transistor self gain versus transistor current ($I_{DS}$) according to one implementation of the present application. In the graphs, the y-axis represents the self gain of a transistor, defined as its transconductance divided by its channel conductivity ($g_M/g_{DS}$), and is a figure of merit transistor designs strive to maximize in order to improve amplifier performance. In the graphs, the x-axis represents the magnitude of the transistor current in the transistor channel.

Trace 498a in FIG. 13A, illustrated as a dotted line, represents the self gain of a conventional transistor at a lesser transistor channel length $L_1$. Channel length is a dimension generally corresponding to the width of a gate finger. Trace 499a in FIG. 13A, illustrated as a solid line, represents the self gain of a transistor according to the present application, such as SOI device structures 218A and 218B in FIGS. 10A and 10B or SOI device structures 318C and 318D in FIGS. 11C and 11D, at the lesser transistor channel length $L_1$. As shown by traces 498a and 499a in FIG. 13A, at a first transistor current $I_1$, the conventional transistor has a lower self gain $G_1$, while the transistor according to the present application has a significantly higher self gain $G_2$. As transistor current $I_{DS}$ increases, the self gain of both transistors decreases, but the transistor according to the present application maintains higher self gain than the conventional transistor. At a second higher transistor current $I_2$, the self gain of both transistor levels out is approximately the same.

Trace 498b in FIG. 13B, illustrated as a dotted line, represents the self gain of a conventional transistor at a greater transistor channel length $L_2$. Trace 499b in FIG. 13B, illustrated as a solid line, represents the self gain of a transistor according to the present application, such as SOI device structures 218A and 218B in FIGS. 10A and 10B or SOI device structures 318C and 318D in FIGS. 11C and 11D, at the greater transistor channel length $L_2$. As shown by traces 498b and 499b in FIG. 13B, at a first transistor current $I_3$, the conventional transistor has a lower self gain $G_3$, while the transistor according to the present application has a significantly higher self gain $G_4$. As transistor current $I_{DS}$ increases, the self gain of both transistors decreases, but the transistor according to the present application maintains higher self gain than the conventional transistor. At a second higher transistor current $I_4$, the self gain of both transistor levels out is approximately the same.

The transistor behavior illustrated in FIG. 13B is generally similar to the transistor behavior illustrated in FIG. 13A, except that the transistor according to the present application exhibits significantly more improvement over the conventional transistor for greater channel length $L_2$ in FIG. 13B. That is, the difference between $G_4$ and $G_3$ in FIG. 13B is significantly greater than the difference between $G_2$ and $G_1$ in FIG. 13A. Thus, SOI device structures 218A and 218B in FIGS. 10A and 10B or SOI device structures 318C and 318D in FIGS. 11C and 11D enable higher gains at greater channel lengths.

SOI devices according to the present invention result in numerous advantages, some of which are stated below with reference to SOI device structures 218A and 218B in FIGS. 10A and 10B. First, since SOI device structures 218A and 218B feature asymmetric halo-implant regions adjoining source regions 250, and feature source regions 250 electrically tied to transistor body 226, SOI device structures 218A and 218B provide improved gain and linearity. Moreover, the improvement is greater than would have been expected from these features individually. Accordingly, SOI device structures 218A and 218B are particularly suited to amplifier circuits for modern wireless communications.

Second, SOI device structures 218A and 218B provide improved gain and linearity without degrading other device performance parameters. In particular, SOI device structures 218A and 218B provide improved gain and linearity, without increased noise compared to conventional transistors. Thus, SOI device structures 218A and 218B may be used flexibly in various stages of an amplifier circuit, as illustrated in FIG. 12B.

Third, SOI device structures 218A and 218B in FIGS. 10A and 10B enable even greater gain improvements at greater channel lengths, as illustrated in FIGS. 13A and 13B. Accordingly, the advantages above are compounded for devices with greater channel lengths.

Fourth, SOI device structures 218A and 218B in FIGS. 10A and 10B can be formed from a typical pre-fabricated SOI wafer such as the SOI wafer shown in FIG. 2. Accordingly, SOI device structures 218A and 218B are suitable for large scale production without premium costs associated with specialty substrates.

Fifth, where SOI device structures 218A and 218B electrically tie transistor body 226 to source regions 250 utilizing heavily-doped body-implant regions 256 and common silicided regions 264, a dedicated contact or specially shaped gate structure can be omitted. Accordingly, SOI device structures 218A and 218B exhibit lower routing parasitics and reduced manufacturing complexity.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor-on-insulator (SOI) device comprising:
   a semiconductor layer situated over a buried oxide layer, said buried oxide layer being situated over a substrate;
   an SOI transistor situated in said semiconductor layer and including a transistor body, gate fingers, source regions, and drain regions;
   said transistor body having a first conductivity type, said source regions and said drain regions having a second conductivity type opposite to said first conductivity type;
   said transistor body electrically tied to at least one of said source regions;
   an asymmetric halo-implant region having said first conductivity type adjoining said at least one of said source regions, wherein no halo-implant region adjoins said drain regions;
   a heavily-doped body-implant region having said first conductivity type overlapping said at least one of said source regions in an overlap region, wherein said asymmetric halo-implant region adjoins said overlap region.

2. The SOI device of claim 1, wherein said SOI transistor further includes lightly-doped source regions and lightly-doped drain regions having said second conductivity type; wherein said asymmetric halo-implant region is situated under at least one of said lightly-doped source regions.

3. The SOI device of claim 1, wherein said asymmetric halo-implant region is situated under a spacer dielectric of at least one of said gate fingers.

4. The SOI device of claim 1, where said SOI transistor is part of a low noise amplifier (LNA).

5. The SOI device of claim 1, where said SOI transistor is part of a power amplifier (PA).

6. The SOI device of claim 1, further comprising a common silicided region electrically tying said heavily-doped body-implant region to said at least one of said source regions.

7. The SOI device of claim 1, wherein said asymmetric halo-implant region adjoins a side of said overlap region.

8. The SOI device of claim 1, wherein said heavily-doped body-implant region is situated partially outside said source regions and near gate contacts.

9. The SOI device of claim 1, wherein said heavily-doped body-implant region is situated inside said source regions and near a center of said gate fingers.

10. The SOI device of claim 1, wherein at least one of said gate fingers comprises a stub adjacent to said heavily-doped body-implant region.

11. A semiconductor device comprising:
    a semiconductor substrate;
    a transistor situated in said semiconductor substrate and including a transistor body, gate fingers, source regions, and drain regions;

said transistor body having a first conductivity type, said source regions and said drain regions having a second conductivity type opposite to said first conductivity type;

said transistor body electrically tied to at least one of said source regions;

an asymmetric halo-implant region having said first conductivity type adjoining said at least one of said source regions, wherein no halo-implant region adjoins said drain regions;

a heavily-doped body-implant region having said first conductivity type overlapping said at least one of said source regions in an overlap region, wherein said asymmetric halo-implant region adjoins said overlap region.

12. The semiconductor device of claim 11, wherein said transistor further includes lightly-doped source regions and lightly-doped drain regions having said second conductivity type;

wherein said asymmetric halo-implant region is situated under at least one of said lightly-doped source regions.

13. The semiconductor device of claim 11, wherein said asymmetric halo-implant region is situated under a spacer dielectric of at least one of said gate fingers.

14. The semiconductor device of claim 11, where said transistor is part of a low noise amplifier (LNA).

15. The semiconductor device of claim 11, where said transistor is part of a power amplifier (PA).

16. The semiconductor device of claim 11, further comprising a common silicided region electrically tying said heavily-doped body-implant region to said at least one of said source regions.

17. The semiconductor device of claim 11, wherein said asymmetric halo-implant region adjoins a side of said overlap region.

18. The semiconductor device of claim 11, wherein said heavily-doped body-implant region is situated partially outside said source regions and near gate contacts.

19. The semiconductor device of claim 11, wherein said heavily-doped body-implant region is situated inside said source regions and near a center of said gate fingers.

20. The semiconductor device of claim 11, wherein at least one of said gate fingers comprises a stub adjacent to said heavily-doped body-implant region.

* * * * *